United States Patent
Nitta et al.

(10) Patent No.: US 10,866,294 B2
(45) Date of Patent: Dec. 15, 2020

(54) MAGNETIC RESONANCE IMAGING APPARATUS, MULTI-SLICE IMAGING METHOD, AND SHIMMING VALUE CALCULATION APPARATUS

(71) Applicant: Canon Medical Systems Corporation, Otawara (JP)

(72) Inventors: Shuhei Nitta, Tokyo (JP); Takashi Watanabe, Yokohama (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 16/391,378

(22) Filed: Apr. 23, 2019

(65) Prior Publication Data

US 2019/0346519 A1  Nov. 14, 2019

(30) Foreign Application Priority Data

May 11, 2018  (JP) .................................. 2018-092523

(51) Int. Cl.
*G01R 33/3875* (2006.01)
*G01R 33/565* (2006.01)
*G01R 33/483* (2006.01)

(52) U.S. Cl.
CPC ..... *G01R 33/3875* (2013.01); *G01R 33/4835* (2013.01); *G01R 33/565* (2013.01)

(58) Field of Classification Search
USPC ........................................................ 324/320
See application file for complete search history.

(56) References Cited

U.S. PATENT DOCUMENTS

| | | | |
|---|---|---|---|
| 2019/0346520 A1* | 11/2019 | Nitta | G01R 33/56563 |
| 2019/0346521 A1* | 11/2019 | Nitta | G01R 33/4835 |
| 2020/0041593 A1* | 2/2020 | Nitta | G01R 33/543 |
| 2020/0041600 A1* | 2/2020 | Nitta | G01R 33/543 |

FOREIGN PATENT DOCUMENTS

JP  7-327960  12/1995

* cited by examiner

*Primary Examiner* — Rodney E Fuller
(74) *Attorney, Agent, or Firm* — Oblon, McClelland, Maier & Neustadt, L.L.P.

(57) ABSTRACT

A magnetic resonance imaging apparatus includes processing circuitry calculating a 0-order shimming value for correcting 0-order components of inhomogeneity of a static magnetic field of a collection region in a multi-slice collection for each of slices in the collection region, first-order shimming values for correcting first-order components of the inhomogeneity for each of the slices in the collection region, and multiple-order shimming values for correcting second or higher-order components of the inhomogeneity over the entire of the collection region, by using a distribution of the static magnetic field in the collection region, and imaging control circuitry performing the multi-slice collection to the collection region by using the 0-order, first-order, and multiple-order shimming values.

6 Claims, 7 Drawing Sheets

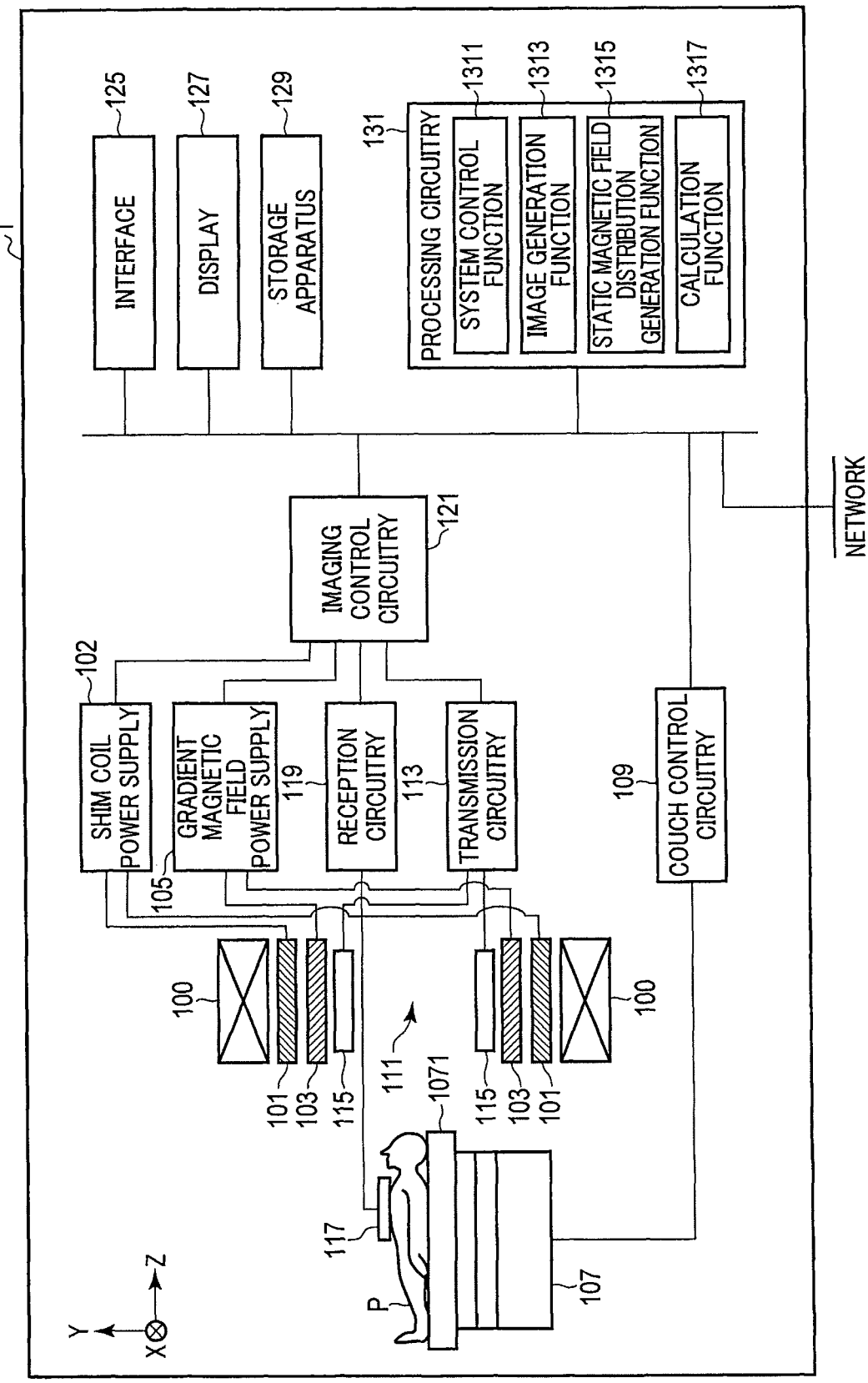
F I G. 1

MAGNETIC RESONANCE IMAGING APPARATUS, MULTI-SLICE IMAGING METHOD, AND SHIMMING VALUE CALCULATION APPARATUS

CROSS-REFERENCE TO RELATED APPLICATIONS

This application is based upon and claims the benefit of priority from the prior Japanese Patent Applications No. 2018-092523, filed May 11, 2018; the entire contents of which are incorporated herein by reference.

FIELD

Embodiments described herein relate generally to a magnetic resonance imaging apparatus, a multi-slice imaging method, and a shimming value calculation apparatus.

BACKGROUND

A technique relating to a magnetic resonance imaging (MRI) apparatus that performs shimming on inhomogeneity of a static magnetic field based on a static magnetic field distribution (hereinafter referred to as "static magnetic field shimming"), has been known. For example, an MRI apparatus optimizes 0-order and first-order shimming value for each slice by performing the static magnetic field shimming relating to multi-slice collection (hereinafter referred to as "per-slice static magnetic field shimming"). However, if second-order shimming values are used in the per-slice static magnetic field shimming, it takes time to stabilize a correction magnetic field generated by a shim coil; accordingly, such second-order shimming values are excluded from a target of the static magnetic field shimming.

BRIEF DESCRIPTION OF THE DRAWINGS

FIG. 1 is a diagram showing a configuration of an MRI apparatus in an embodiment.

DETAILED DESCRIPTION

Figure 2:
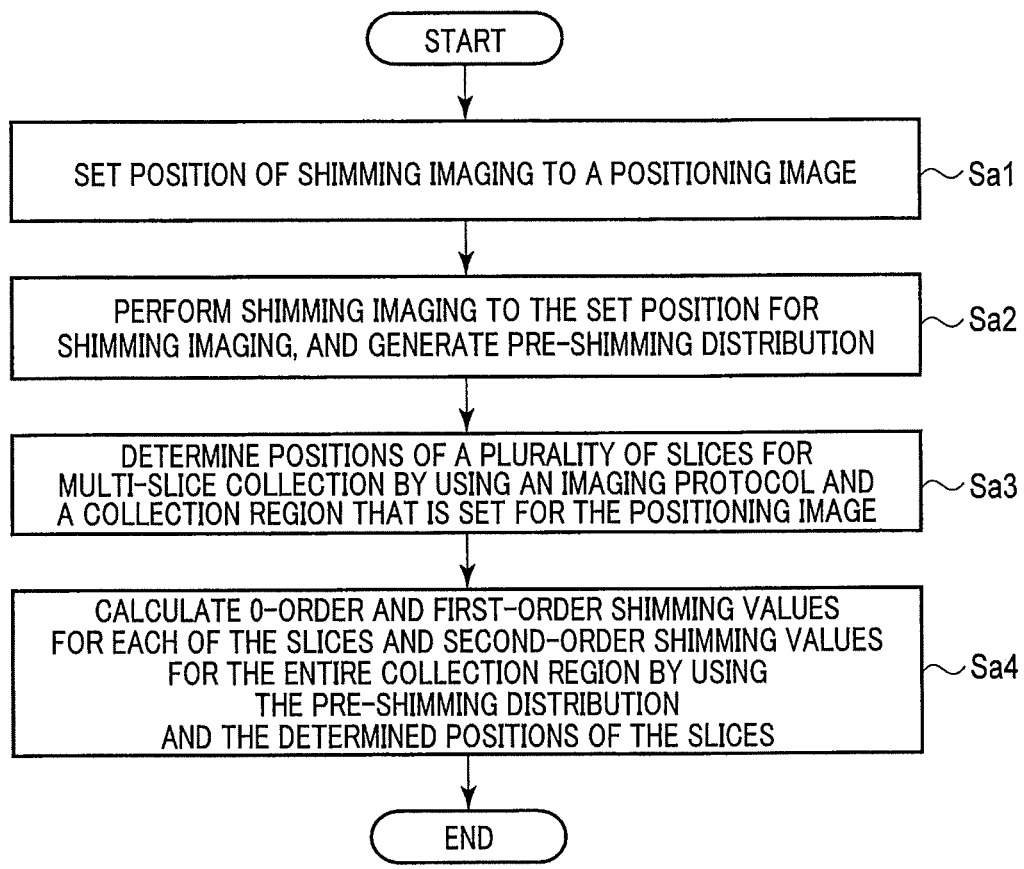
FIG. 2 is a diagram showing an example of a procedure relating to shimming value calculation processing in the embodiment.

According to one embodiment, a magnetic resonance imaging apparatus has both processing circuitry and imaging control circuitry.

The processing circuitry calculates 0-order shimming value relating to correction with respect to 0-order components of inhomogeneity of a static magnetic field of a collection region, in multi-slice collection, for each of a plurality of slices in the collection region, first-order shimming values relating to correction of first-order components of inhomogeneity for each of the slices in the collection region, and multiple-order shimming values relating to correction of second or higher-order components of the inhomogeneity over the entire of the collection region, by using a distribution of the static magnetic field in the collection region.

The imaging control circuitry performs the multi-slice collection to the collection region by using the 0-order shimming value, the first-order shimming values, and the multiple-order shimming values.

An object is to improve accuracy of static magnetic field shimming.

Hereinafter, embodiments of the magnetic resonance imaging (MRI) apparatus will be described with reference to the drawings. In the following description, structural elements having substantially the same functions and configurations will be denoted by the same reference symbols, and a repetitive description of such elements will be given only where necessary.

Embodiment

The general configuration of an MRI apparatus 1 in the present embodiment will be described with reference to FIG. 1. FIG. 1 is a diagram showing a configuration of the MRI apparatus 1 in the present embodiment. As shown in FIG. 1, the MRI apparatus 1 includes a static field magnet 100, a shim coil 101, a shim coil power supply 102, a gradient coil 103, a gradient magnetic field power supply 105, a couch 107, couch control circuitry 109, transmission circuitry 113, a transmission coil 115, a reception coil 117, reception circuitry 119, imaging control circuitry 121, an interface 125, a display 127, a storage apparatus 129, and processing circuitry 131. The couch control circuitry 109, the imaging control circuitry 121, the interface 125, the display 127, the storage apparatus 129, and the processing circuitry 131 are connected either wirelessly or with wires for data transmission. A subject P is not included in the MRI apparatus 1.

The static field magnet 100 is a magnet formed in a hollow, approximately cylindrical, shape. The static field magnet 100 generates an approximately homogeneous static magnetic field in the inner space. For example, a superconducting magnet or the like is used as the static field magnet 100. As shown in FIG. 1, the Z-axis direction is defined as the same as the orientation of the static magnetic field. In addition, the Y-axis direction is a vertical direction, and the X-axis direction is a direction perpendicular to each of the Z-axis and the Y-axis.

The shim coil 101 generates a correction magnetic field that corrects second-order or higher order components of inhomogeneity of a static magnetic field generated by the static field magnet 100. The shim coil 101 is joined to an outer surface of the gradient coil 103, with an insulation layer (not shown) being interposed therebetween. Generally, inhomogeneity of a static magnetic field is expressed by components, such as a 0-order component, first-order components $X^1$, $Y^1$, $Z^1$, and second-order components $X^2$, $Y^2$, $Z^2$, XY, YZ, ZX. There may be third-order or higher order components in inhomogeneity of a static magnetic field. A multiple-order component is a second or higher-order component.

To simplify the description hereinafter, let us suppose a high-order component is a second-order component. In this case, the shim coil 101 has a second-order shim structure. In addition, the shim coil 101 has, for example, five coil patterns each corresponding to second-order components of inhomogeneity of a static magnetic field, ZX, XY, YZ, $(Z^2-(X^2+Y^2)/2)$, and $(X^2-Y^2)$. The five coil patterns of the shim coil 101 respectively generate a five-channel correction magnetic field for correcting the second-order components of inhomogeneity of the static magnetic field, ZX, XY, YZ, $(Z^2-(X^2+Y^2)/2)$, and $(X^2-Y^2)$, in accordance with a current supplied from the shim coil power supply 102. When static magnetic field shimming is performed in consideration of multiple-order components of inhomogeneity of a static magnetic field, the shim coil 101 has coil patterns in accordance with the multiple-order components. The static magnetic field shimming in the present embodiment will be described later.

The shim coil power supply 102 is a power supply apparatus that supplies a current to the shim coil 101 under the control of the imaging control circuitry 121. Specifically, the shim coil power supply 102 independently supplies a current to each of the five coil patterns in the shim coil 101. In other words, the shim coil power supply 102 supplies each of the five coil patterns in the shim coil 101 with a current corresponding to a second-order shimming value determined by the static magnetic field shimming in the present embodiment.

The gradient coil 103 is a coil formed in a hollow, approximately cylindrical, shape. The gradient coil 103 is arranged inside the shim coil 101. The gradient coil 103 is formed by combining three coils respectively corresponding to the X-, Y-, and Z-axes which are orthogonal to each other. These three coils in the gradient coil 103 are separately supplied with a current from the gradient magnetic field power supply 105, and respectively generate a gradient magnetic field in which intensity of the magnetic field changes along each of the X-, Y-, and Z-axes.

The gradient magnetic field power supply 105 is a power supply apparatus that supplies a current to the gradient coil 103 under the control of the imaging control circuitry 121. Specifically, the gradient coil corresponding to the X-axis generates, through the supply of a current from the gradient magnetic field power supply 105, a correction magnetic field having approximately the same magnetic field direction as the $X^1$ component of inhomogeneity of the static magnetic field, and a gradient magnetic field for frequency encoding. The gradient coil corresponding to the Y-axis generates, through the supply of a current from the gradient magnetic field power supply 105, a correction magnetic field having approximately the same magnetic field direction as the $Y^1$ component of inhomogeneity of the static magnetic field, and a gradient magnetic field for phase encoding. The gradient coil corresponding to the Z-axis generates, through the supply of a current from the gradient magnetic field power supply 105, a correction magnetic field having approximately the same magnetic field direction as the $Z^1$ component of inhomogeneity of a static magnetic field, and a gradient magnetic field for slice selection. In other words, three gradient magnetic field coils respectively corresponding to the X-, Y-, and Z-axes are used to correct first-order components of inhomogeneity of the static magnetic field, in addition to the generation of the gradient magnetic fields relating to imaging.

The couch 107 is an apparatus having a couch top 1071 on which a subject P is laid. The couch 107 inserts the couch top 1071 on which the subject P is laid into the bore 111, under the control of the couch control circuitry 109. The couch 107 is installed in, for example, an examination room in such a manner that the longitudinal axis of the couch 107 is parallel to the central axis of the static field magnet 100.

The couch control circuitry 109 is the circuitry that controls the couch 107. The couch control circuitry 109 drives the couch 107 in accordance with an operator's instruction, input via the interface 125, to move the couch top 1071 in a longitudinal direction and a vertical direction. The couch control circuitry 109 is an example of a means of realizing a couch control unit.

The transmission circuitry 113 supplies a high-frequency pulse modulated by a Larmor frequency to the transmission coil 115 under the control of the imaging control circuitry 121. The transmission circuitry 113 is an example of a means of realizing a transmission unit.

The transmission coil 115 is an RF coil provided inside the gradient coil 103. The transmission coil 115 generates an RF pulse corresponding to a radio frequency magnetic field in accordance with an output from the transmission circuitry 113. The transmission coil 115 is, for example, a whole-body coil (WB coil) including a plurality of coil elements. The WB coil may be used as a transmission/reception coil. The transmission coil 115 may also be a WB coil made of a single coil.

The reception coil 117 is an RF coil provided inside the gradient coil 103. The reception coil 117 receives MR signals emitted from the subject P, caused by the high frequency magnetic field. The reception coil 117 outputs the received MR signals to the reception circuitry 119. The reception coil 117 is a coil array including, for example, one or more, typically, a plurality of coil elements. In FIG. 1, the transmission coil 115 and the reception coil 117 are illustrated as separate RF coils; however, the transmission coil 115 and the reception coil 117 may be implemented as an integrated transmission/reception coil. The transmission/reception coil is, for example, a local transmission/reception RF coil, such as a head coil, to serve an imaging target in the subject P.

The reception circuitry 119 generates digital MR signals (hereinafter referred to as "MR data") based on the MR signals output from the reception coil 117, under the control of the imaging control circuitry 121. Specifically, the reception circuitry 119 performs various types of signal processing to the MR signals that are output from the reception coil 117, and then performs analog-to-digital (A/D) conversion of data to which the variety of signal processing is performed. The reception circuitry 119 samples the A/D-converted data and thereby generates MR data. The reception circuitry 119 then outputs said generated MR data to the imaging control circuitry 121. The reception circuitry 119 is an example of a means of realizing a reception unit.

The imaging control circuitry 121 controls, for example, the shim coil power supply 102, the gradient magnetic field power supply 105, the transmission circuitry 113, and the reception circuitry 119 in accordance with an imaging protocol that is output from the processing circuitry 131, and performs imaging on the subject P. An imaging protocol has different pulse sequences in accordance with a body part targeted for imaging and a type of examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and time width of the high frequency pulse supplied from the transmission circuitry 113 to the transmission coil 115, timing of the supply of the high frequency pulse from the transmission circuitry 113 to the transmission coil 115, and timing of reception of the MR signals at the reception coil 117, etc. The imaging control circuitry 121 is an example of a means of realizing an imaging unit.

In order to receive various instructions and information inputs from an operator, the interface 125 is realized by a switch button, a mouse, a keyboard, a touch pad with which an input operation can be performed by touching its operation screen; a touch screen in which a display screen and a touch pad are integrated; and non-contact input circuitry using an optical sensor, or sound input circuitry, etc. The interface 125, which is connected to the processing circuitry 131, etc., converts an input operation received from the operator into an electric signal, and outputs the signal to the processing circuitry 131. In the present specification, the interface is not limited to physical operation components such as a mouse and a keyboard. For example, the interface 125 also includes electrical signal processing circuitry that receives an electrical signal corresponding to an input operation through an external input device provided independently from the apparatus, and outputs the electrical signal to the system control circuitry. The interface 125 is an example of a means that realizes an input unit.

The display 127 displays, for example, various MR images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or a monitor known in this technical field. The display 127 is an example of a means that realizes a display unit.

The storage device 129 stores, for example, MR data filled in the k-space with the use of the image generation function 1313, image data generated by the image generation function 1313, imaging protocols, imaging conditions including the imaging parameters defining the imaging protocols, and the like. The storage apparatus 129 stores programs corresponding to various functions executed by the processing circuitry 131. The storage apparatus 129 stores a program for calculating a 0-order shimming value, first-order shimming values, and second-order shimming values based on static magnetic field shimming in the present embodiment (hereinafter, "a calculation program").

The 0-order shimming value corresponds to a resonance frequency of water in each of the slices of a collection region in multi-slice collection. In other words, the 0-order shimming value relates to correction with respect to a 0-order component of inhomogeneity of a static magnetic field in each of the slices in the collection region. The first-order shimming values correspond to values of currents respectively supplied to the three gradient coils from the gradient magnetic field power supply 105, so as to correct the $X^1$, $Y^1$, and $Z^1$ components of inhomogeneity of the static magnetic field in each of the slices in the multi-slice collection. In other words, the first-order shimming values relate to correction of the first-order components of inhomogeneity of the static magnetic field in each of the slices of the collection region. The second-order shimming values correspond to values of currents respectively supplied to the five coil patterns in the shim coil 101 from the shim coil power supply 102 so as to correct the ZX, XY, YZ, $(Z^2-(Z^2+Y^2)/2)$, $(X^2-Y^2)$ components of inhomogeneity of the static magnetic field in the entire collection region of the multi-slice collection. In other words, the second-order shimming values relate to correction of the second-order components of inhomogeneity of the static magnetic field in the collection region.

The storage apparatus 129 is, for example, a semiconductor memory element, such as a RAM (Random Access Memory) and a flash memory, a hard disk drive, a solid state drive, or an optical disk, etc. The storage device 129 may be a drive, etc. configured to read and write various kinds of information on a portable storage medium such as a CD-ROM drive, a DVD drive, or a flash memory, etc. The storage 129 is an example of a means of realizing a storage unit.

The processing circuitry 131 includes, as hardware resources, a processor and a memory such as a read-only memory (ROM) and a RAM (not shown) and controls the present MRI apparatus 1. For example, the processing circuitry 131 includes a system control function 1311, an image generation function 1313, a statistic magnetic field distribution generation function 1315, and a calculation function 1317. The various types of functions executed by the system control function 1311, the image generation function 1313, the static magnetic field distribution generation function 1315, and the calculation function 1317, are stored in the storage apparatus 129 in a form of a computer-executable program. The processing circuitry 131 is a processor which reads a program corresponding to each of those functions from the storage apparatus 129 and executes the program to realize the function corresponding to the program. In other words, the processing circuitry 131, in a state where each of the programs is read, has a plurality of the functions etc. shown in the processing circuitry 131 of FIG. 1.

FIG. 1 illustrates the case where the various functions are realized in a single processor; however, the processing circuitry 131 may be constituted by a combination of independent processors, and the functions may be realized through the processors executing the programs. In other words, each of the above-mentioned functions may be configured as a program, and executed by a single processing circuit; alternatively, a specific function may be implemented in a dedicated independent program-execution circuit. Although FIG. 1 illustrates the single storage apparatus 129, which stores a program corresponding to each processing function, a plurality of storage apparatus may be provided and the processing circuitry 131 may be configured to read a corresponding program from each storage apparatus.

The term "processor" used in the above description means, for example, a CPU (central processing unit), a GPU (graphics processing unit), or circuitry such as an ASIC (application specific integrated circuit), or a programmable logic device (e.g., an SPLD (simple programmable logic device), a CPLD (complex programmable logic device), or a FPGA (field programmable gate array)).

The processor realizes various functions by reading and executing programs stored in the storage apparatus 129. A program may be directly integrated into the circuitry of the processor, instead of storing the program on the storage apparatus 129. In this case, the function is realized through reading and executing the program integrated into the circuitry. Similarly, the bed control circuitry 109, the transmission circuitry 113, the reception circuitry 119, and the imaging control circuitry 121, etc. are constituted by an electronic circuit such as the above-described processor.

The processing circuitry 131 controls the MRI apparatus 1 via the system control function 1311. Specifically, the processing circuitry 131 reads the system control program stored in the storage apparatus 129, loads it in the memory, and controls each circuitry and each power supply of the present MRI apparatus 1 in accordance with the loaded system control program. For example, the processing circuitry 131 reads an imaging protocol from the storage apparatus 129, based on an imaging condition that has been input by an operator through the interface 125. The processing circuitry 131 may also generate an imaging protocol based on conditions for imaging. The processing circuitry 131 transmits the imaging protocol to the imaging control circuitry 121, and controls imaging on the subject P. The processing circuitry 131 that executes the system control function 1311 is an example of a means that realizes a system control unit.

The processing circuitry 131 fills MR data along a readout direction of k-space in accordance with, for example, an intensity of the readout gradient magnetic field via the image generation function 1313. The processing circuitry 131 generates an MR image by executing a Fourier transform to the MR data filled in k-space. The processing circuitry 131 outputs the generated MR image to the display 127 and the storage apparatus 129. The processing circuitry 131 that performs the image generation function 1313 is an example of a means that realizes an image generation unit.

The above is the general description of the overall configuration of the MRI apparatus 1 according to the present embodiment. Hereinafter, the operations relating to the static magnetic field distribution generation function 1315 and the calculation function 1317 in the present embodiment will be described with reference to FIG. 2. FIG. 2 shows an example of a procedure relating to the processing of the calculation of a 0-order shimming value, first-order shimming values and second-order shimming values by the static magnetic field shimming in the present embodiment.

(Shimming Value Calculation Processing)
(Step Sa1)

The imaging control circuitry 121 performs positioning imaging. Courtesy of the image generation function 1313, the processing circuitry 131 generates a positioning image by using an MR signal collected by positioning imaging. The processing circuitry 131 outputs the generated positioning images to the display 127. The display 127 displays the generated positioning image on, for example, a scan plan screen. A position for shimming imaging is set in accordance with the operator's instruction input in the interface 125.

(Step Sa2)

The imaging control circuitry 121 performs shimming imaging to a subject P in accordance with the position for shimming imaging that is set within the positioning image. The imaging control circuitry 121 performs shimming imaging by, for example, multi-slice imaging which adopts a double-echo method in which two different echo time intervals are used. The shimming imaging may be performed by other imaging methods, such as a multi-slice imaging method which adopts a triple-echo method in which three different echo time intervals are used. The region where the shimming imaging is performed (hereinafter, "the shimming region") overlaps at least partially with a collection region of the multi-slice collection performed in the main scanning. Specifically, the imaging control circuitry 121 controls the gradient magnetic power supply 105, the transmission circuitry 113, and the reception circuitry 119, in accordance with the double-echo method. The imaging control circuitry 121 collects MR signals corresponding to two echo time intervals via the reception coil 117 and the reception circuitry 119 by shimming imaging.

The processing circuitry 131 generates, by the static magnetic field distribution generation function 1315, a plurality of static magnetic field distributions respectively corresponding to a plurality of slices in the shimming region, based on the MR signals collected by the shimming imaging. Specifically, the processing circuitry 131 generates two complex images respectively corresponding to the two echo time intervals, based on the MR signals of the slices in the shimming region. The processing circuitry 131 performs complex conjugate calculation to one of the two complex images, and calculates a product of the complex image to which complex conjugate calculation has been performed and the other complex image to which complex conjugate calculation has not been performed. The processing circuitry 131 generates a phase difference image by using a phase of the calculated product.

The processing circuitry 131 generates, via the static magnetic field distribution generation function 1315, an intensity image by using at least one of the two complex images. The processing circuitry 131 extracts a background region in the phase difference image based on the intensity image. The processing circuitry 131 removes the background from the phase difference image by using the extracted background region. The processing circuitry 131 performs a phase unwrap processing in consideration of continuity of phase to the phase difference image from which the background has been removed. The processing circuitry 131 performs linear conversion to a value of the phase difference in each pixel in the phase difference image to which the phase unwrap processing has been performed, by using an echo interval corresponding to a difference of the two echo time intervals and a gyromagnetic ratio, thereby generating a two-dimensional static magnetic field distribution as frequency information. The processing circuitry 131 generates a three-dimensional static magnetic field distribution (hereinafter, "pre-shimming distribution") by coupling multiple two-dimensional static magnetic field distributions. The processing circuitry 131 directs the storage apparatus 129 to store the generated pre-shimming distribution. The foregoing procedure relating to the generation of pre-shimming distribution is merely an example, and the present embodiment is not limited thereto.

(Step Sa3)

The interface 125 sets a collection region relating to multi-slice collection to the positioning image courtesy of an operator's instruction. The interface 125 inputs various types of information for specifying an imaging protocol for the multi-slice collection courtesy of an operator's instruction. The various types of information are, for example, a body part targeted for imaging, imaging conditions, contrast, imaging purpose, and the like. The processing circuitry 131 specifies, by the system control function 1311, an imaging protocol corresponding to the input information among a plurality of imaging protocols stored in the storage apparatus 129. The processing circuitry 131 reads the specified imaging protocol from the storage apparatus 129. The processing circuitry 131 sets the read imaging protocol as an imaging protocol to be performed in the multi-slice collection to a subject P. The processing circuitry 131 determines positions of multiple slices relating to the multi-slice imaging, by using the specified imaging protocol and the set collection region. A collection direction may be set for the positioning image courtesy of an operator's instruction that is input via the interface 125.

(Step Sa4)

The processing circuitry 131 calculates, through the calculation function 1317 and by using a method of least squares, 0-order shimming value and first-order shimming values in each of the slices in the collection region and second-order shimming values in the entire collection region. This is based on the pre-shimming distribution and the determined positions of the multiple slices. Specifically, the processing circuitry 131 reads a calculation program from the storage apparatus 129, and develops and executes the program in its own memory, thereby performing static magnetic field shimming in the present embodiment. Prior to describing the static magnetic field shimming in the present embodiment, a basic expression relating to static magnetic field shimming for optimizing 0-order shimming value and first-order shimming values throughout the overall collection region (hereinafter "first global shimming") will be first described. Static magnetic field shimming for optimizing 0-order shimming value and first-order shimming values for each slice of the collection region (hereinafter, "per-slice static magnetic field shimming") will then be described. Static magnetic field shimming using the shim coil 101 capable of spatially applying a two-dimensional correction magnetic field distribution (hereinafter "second global shimming") will then be described. Lastly, static magnetic field shimming in the present embodiment will be described.

1. First Global Shimming

An example of a basic expression relating to the first global shimming is shown in the expression (1) below.

$$b'_0(x,y,z)=a_0+a_1x+a_2y+a_3z+b_0(x,y,z) \quad (1)$$

Herein, (x,y,z) in the expression (1) is a three-dimensional position in a space. Specifically, the variable x represents a position with respect to a center of the static magnetic field in the horizontal direction (X-axis) (hereinafter "magnetic field center"), which is defined as an origin. The variable y represents a position with respect to the magnetic field center in the vertical direction (Y-axis) as an origin. The variable z represents a position with respect to the magnetic field center in the axial direction (Z-axis) as an origin. Herein, a unit of each of x, y, z is [m]. a0 in the expression (1) is 0-order shimming value. a0 represents a value to which a minus sign is put to a center frequency of an RF pulse. A unit of a0 is [ppm]. a1, a2, and a3 in the expression (1) are first-order shimming values. Specifically, a1, a2, and a3 represent an amount of change in a resonance frequency per unit length for each of the X-, Y-, and Z-axes, respectively. An amount of change in a resonance frequency per unit length corresponds to a gradient of the gradient magnetic field, in other words, a value of current applied to the gradient coil 103. A unit of a1, a2, a3 is [ppm/m]. $b_0(x,y,z)$ in the expression (1) is a resonance frequency in the position (x,y,z) before the static magnetic field shimming is performed. In other words, $b_0(x,y,z)$ is a result of converting the three-dimensional static magnetic field distribution into a resonance frequency, namely a distribution of resonance frequencies representing inhomogeneity of the static magnetic field. A unit of $b_0(x,y,z)$ is [ppm]. $b'_0(x,y,z)$ is a difference value representing a difference between a resonance frequency in the position (x,y,z) after shimming and a center frequency of an RF pulse. A unit of $b'_0(x,y,z)$ is [ppm].

The left side of the expression (1), namely the difference value regarding the resonance frequency after shimming and the center frequency of the RF pulse becomes a desirable condition for static magnetic field shimming, if the value is smaller. If a set of all positions of a plurality of pixels in a foreground region (hereinafter, foreground pixels) corresponding to a non-foreground region (hereinafter, a position set S) is considered for an image representing the pre-shimming distribution, the position set S can expressed by the expression (2) below:

$$S \in \{(x_i,y_i,z_i)^T\}, i=1,2,\ldots,N \quad (2)$$

In the expression (2), i represents a serial number of a foreground pixel. N represents a total number of the foreground pixels.

At this time, N expressions (1) can be established for all the foreground pixels in the image of the pre-shimming distribution. If the N expressions (1) for all the foreground pixels are combined, the expression (3) below can be obtained:

$$\begin{pmatrix} b'_0(x_1,y_1,z_1) \\ \vdots \\ b'_0(x_N,y_N,z_N) \end{pmatrix} = \begin{pmatrix} 1 & x_1 & y_1 & z_1 \\ \vdots & \vdots & \vdots & \vdots \\ 1 & x_N & y_N & z_N \end{pmatrix} \begin{pmatrix} a_0 \\ a_1 \\ a_2 \\ a_3 \end{pmatrix} + \begin{pmatrix} b_0(x_1,y_1,z_1) \\ \vdots \\ b_0(x_N,y_N,z_N) \end{pmatrix} \quad (3)$$

In the expression (3), if a vector b', a matrix X, a vector a, and a vector b are defined as follows:

$$b' = \begin{pmatrix} b'_0(x_1,y_1,z_1) \\ \vdots \\ b'_0(x_N,y_N,z_N) \end{pmatrix}, x = \begin{pmatrix} 1 & x_1 & y_1 & z_1 \\ \vdots & \vdots & \vdots & \vdots \\ 1 & x_N & y_N & z_N \end{pmatrix}, a = \begin{pmatrix} a_0 \\ a_1 \\ a_2 \\ a_3 \end{pmatrix},$$

$$b = \begin{pmatrix} b_0(x_1,y_1,z_1) \\ \vdots \\ b_0(x_N,y_N,z_N) \end{pmatrix}$$

the expression (3) can then be expressed as shown in the expression (4) below:

$$b'=Xa+b \quad (4)$$

As aforementioned, the smaller each element of the vectors in the left side of the expression (1), namely the left side of the expression (3) or (4), is, the more ideal it becomes for static magnetic field shimming. Accordingly, homogeneity of the static magnetic field is defined as an amplitude of the vector b', and the cost function E regarding the vector a, which is obtained by combining a 0-order shimming value and first-order shimming values, is defined as the expression (5).

$$E(a)=(Xa+b)^T\Omega^{-1}(Xa+b) \quad (5)$$

The matrix $\Omega$ in the expression (5) is a matrix for normalization which is performed based on the importance of each element in the vector b' and correlation between the elements. For example, if the matrix $\Omega$ is a unitary matrix, the cost function is simply a sum of squares of the vector elements. If the matrix $\Omega$ is a covariance matrix relating to the vector b', the cost function is a square of Mahalanobis' distance. The vector a, which is a combination of the 0-order shimming value and first-order shimming values, that minimizes the cost function (5) can be determined by the expression (6) shown below with the use of a least-squares method.

$$\hat{a}=\text{argmin}_a E(a) \quad (6)$$

2. Per-Slice Static Magnetic Field Shimming

When a set of positions of a plurality of foreground pixels is considered for each slice $S_j$ of an examination image of multi-slice collection in which per-slice static magnetic field shimming is performed, the position set $S_j$ can be expressed by the expression (7) below, for example:

$$S_j \in \{(x_i, y_i, z_i)^T\} j=1,2,\ldots,M, i=1,2,\ldots,N_j \quad (7)$$

In the expression (7), j represents a serial number of the slices of the examination image. M in the expression (7) represents the number of slices in the examination image. i in the expression (7) represents a serial number of a foreground pixel. $N_j$ represents the total number of the foreground pixels in a slice j.

In this case, $N_j$ expressions (1) can be established for each slice in the examination image. In the slice j, a vector $b_j'$, a matrix $X_j$, a vector $a_j$, and a vector $b_j$ are defined as follows:

$$b_j' = \begin{pmatrix} b_0'(x_1, y_1, z_1) \\ \vdots \\ b_0'(x_{N_j}, y_{N_j}, z_{N_j}) \end{pmatrix}, X_j = \begin{pmatrix} 1 & x_1 & y_1 & z_1 \\ \vdots & \vdots & \vdots & \vdots \\ 1 & x_{N_j} & y_{N_j} & z_{N_j} \end{pmatrix}$$

$$a_j = \begin{pmatrix} a_0(j) \\ a_1(j) \\ a_2(j) \\ a_3(j) \end{pmatrix}, b_j = \begin{pmatrix} b_0(x_1, y_1, z_1) \\ \vdots \\ b_0(x_{N_j}, y_{N_j}, z_{N_j}) \end{pmatrix}$$

The vector $b_j$ corresponds to the entire foreground pixels in the static magnetic field distribution corresponding to the slice j, among the plurality of static magnetic field distributions related to the aforementioned pre-shimming distribution. In the slice j, if the $N_j$ expressions (1) for all the foreground pixels are combined, the expression (8) below can be obtained:

$$b_j' = X_j a_j + b_j \quad (8)$$

Regarding the expression (8), by defining the cost function as the expression (5) and solving the same, M patterns of the vector $a_j$, which is a combination of 0-order shimming value and first-order shimming values for each slice of the examination image, are calculated. In other words, by performing shimming using a value of $a_j$ for each of the multiple slices, examination image collection by the per-slice static magnetic field shimming can be realized.

3. Second Global Shimming

A basic expression relating to the second global shimming using a shim coil capable of spatially applying a two-dimensional correction magnetic field distribution is shown as the expression (9) below:

$$b_0'(x,y,z) = a_0 + a_1 x + a_2 y + a_3 z + a_4 zx + a_5 xy + \\ a_6 yz + a_7 \left(z^2 - \frac{x^2+y^2}{2}\right) + a_8(x^2 - y^2) + b_0(x,y,z) \quad (9)$$

x, y, z, $a_0$, $a_1$, $a_2$, $a_3$, $b_0$, $b_0'$ in the expression (9) are defined similarly to those in the expression (1). $a_4$, $a_5$, $a_6$, $a_7$, and $a_8$ are second-order shimming values. Specifically, each of $a_4$, $a_5$, $a_6$, $a_7$, and $a_8$ represents an amount of change in a spatial non-linear resonance frequency. An amount of change in a spatial non-linear resonance frequency corresponds to a value of a current applied to the shim coil 101. A unit of $a_4$, $a_5$, $a_6$, $a_7$, and $a_8$ is [ppm/m²].

In this case, N expressions (9) can be established for all the foreground pixels within the three-dimensional static magnetic field distribution image, and they can be combined as the expression (10) shown below:

$$\begin{pmatrix} b_0'(x_1, y_1, z_1) \\ \vdots \\ b_0'(x_N, y_N, z_N) \end{pmatrix} = \quad (10)$$

$$\begin{pmatrix} 1 & x_1 & y_1 & z_1 & z_1 x_1 & x_1 y_1 & y_1 z_1 & z_1^2 - \frac{x_1^2+y_1^2}{2} & x_1^2 - y_1^2 \\ \vdots & \vdots & \vdots & \vdots & \vdots & \vdots & \vdots & \vdots & \vdots \\ 1 & x_N & y_N & z_n & z_N x_N & x_N z_N & y_N z_N & z_N^2 - \frac{x_N^2+y_N^2}{2} & x_N^2 - y_N^2 \end{pmatrix}$$

$$\begin{pmatrix} a_0 \\ a_1 \\ a_2 \\ a_3 \\ a_4 \\ a_5 \\ a_6 \\ a_7 \\ a_8 \end{pmatrix} + \begin{pmatrix} b_0(x_1, y_1, z_1) \\ \vdots \\ b_0(x_N, y_N, z_N) \end{pmatrix}$$

In the expression (10), if a vector b', a vector a, a vector b, a matrix X, a matrix X', and a matrix X'' are defined as follows:

$$b' = \begin{pmatrix} b_0'(x_1, y_1, z_1) \\ \vdots \\ b_0'(x_N, y_N, z_N) \end{pmatrix}, a' = \begin{pmatrix} a_0 \\ a_1 \\ a_2 \\ a_3 \\ a_4 \\ a_5 \\ a_6 \\ a_7 \\ a_8 \end{pmatrix}, b = \begin{pmatrix} b_0(x_1, y_1, z_1) \\ \vdots \\ b_0(x_N, y_N, z_N) \end{pmatrix},$$

$$X = \begin{pmatrix} 1 & x_1 & y_1 & z_1 \\ \vdots & \vdots & \vdots & \vdots \\ 1 & x_N & y_N & z_N \end{pmatrix},$$

$$X' = \begin{pmatrix} z_1 x_1 & x_1 y_1 & y_1 z_1 & z_1^2 - \frac{x_1^2+y_1^2}{2} & x_1^2 - y_1^2 \\ \vdots & \vdots & \vdots & \vdots & \vdots \\ z_N x_N & x_N y_N & y_N z_N & z_N^2 - \frac{x_N^2+y_N^2}{2} & x_N^2 - y_N^2 \end{pmatrix},$$

$$X'' = (X \quad X')$$

the expression (10) can then be expressed as shown in the expression (11) below:

$$b' = X'' a' + b \quad (11)$$

Since the equation (11) has the same form as the expression (4) except for the matrix X'' and the size of the vector a', the vector a', which is a combination of the 0-order, first-order, and second-order shimming values, can be determined in a manner similar to the case of solving the equations (5) and (6).

4. Static Magnetic Field Shimming in the Present Embodiment

The static magnetic field shimming in the present embodiment using 0-order, first-order, and second-order shimming values is formulated. Unlike with the 0-order and first-order shimming, it takes more time for the magnetic field to become stable in the second-order shimming after a current is applied to the shim coil 101; accordingly, it is difficult to rapidly switch the correction magnetic field per slice when multi-slice collection is performed. Thus, an object of the static magnetic field shimming in the present embodiment is to calculate an appropriate amount of correction per slice for the 0-order shimming and first-order shimming on the assumption that the second-order shimming is performed for all the slices in the collection region. To summarize the above, a basic expression of the static magnetic field shimming in the present embodiment can be expressed as the expression (12) below:

$$b' = X''' a'' + b \tag{12}$$

In the expression (12), if a vector b', a matrix X''', a vector a'', and a vector b are defined as follows:

$$b' = \begin{pmatrix} b'_1 \\ \vdots \\ b'_M \end{pmatrix}, X''' = \begin{pmatrix} X_1 & 0 & 0 & X' \\ 0 & \ddots & 0 & X' \\ 0 & 0 & X_M & X' \end{pmatrix}, a'' = \begin{pmatrix} a_1 \\ \vdots \\ a_M \\ a_4 \\ a_5 \\ a_6 \\ a_7 \\ a_8 \end{pmatrix}, b = \begin{pmatrix} b_1 \\ \vdots \\ b_M \end{pmatrix}$$

The expression (12) has the same form as the expression (4). For this reason, the processing circuitry 131 can calculate, by the calculation function 1317, the vector a'', which is a combination of the 0-order and first-order shimming values of each slice in the collection region and the second-order shimming values of the entire collection region, in a manner similar to the case of solving the expressions (5) and (6). Specifically, the processing circuitry 131 defines a cost function similarly to the expression (5). The processing circuitry 131 calculates the vector a'', which is a combination of the 0-order, first-order, and second-order shimming values, by the least-squares method with which the cost function relating to the expression (12) is minimized.

In other words, in step Sa4, the processing circuitry 131 calculates, by the calculation function 1317, 0-order and first-order shimming values corresponding to each of the slices, and second-order shimming values corresponding to a value of a current steadily supplied to the shim coil 101 during the multi-slice collection, by using the pre-shimming distribution and the cost function similar to the expression (5). The processing circuitry 131 outputs the calculated 0-order, first-order, and second-order shimming values to the imaging control circuitry 121, along with the imaging protocol and the direction of collection. The processing circuitry 131 that executes the calculation function 1317 is an example of a means that realizes a calculation unit.

When a correction is made to multiple-order components relating to global inhomogeneity of the static magnetic field over the multiple slices in the multi-slice collection, the processing circuitry 131 calculates 0-order, first-order, and multiple-order shimming values by a calculation program. In other words, the processing circuitry 131 collectively performs the per-slice static magnetic field shimming for optimizing the 0-order and first-order shimming values for each slice in the collection region, and the multiple-order shimming for optimizing the multiple-order components of inhomogeneity of the static magnetic field throughout the entire collection region, thereby calculating the 0-order, first-order, and multiple-order shimming values.

The processing circuitry 131 may direct, by the calculation function, the storage apparatus 129 to store the calculated 0-order, first-order, and second-order shimming values (hereinafter "results of shimming"), which are associated with an imaging protocol and information of a subject P (patient ID, weight, height, sex, etc.). For example, if the same imaging protocol is performed to the same subject in the same collection direction in re-examination, etc., the processing circuitry 131 may read, by the system control function 1311, the results of shimming from the storage apparatus 129 and direct the display 127 to display the results of shimming. In this case, the results of shimming may be adjusted as appropriate, or subjected to shimming value calculation processing once again, in accordance with an operator's instruction that is input via the interface 125.

After the processing in step Sa4, the imaging control circuitry 121 determines a center frequency of an RF pulse corresponding to each of the slices in the collection region (hereinafter "frequency per slice") by inverting a sign of the 0-order shimming value calculated for each slice, in other words, by multiplying a negative value with the 0-order shimming value. The imaging control circuitry 121 performs multi-slice collection to the collection region, by using the determined frequency per slice, the first-order shimming values per slice, the second-order shimming values for the entire collection region, and the collection direction.

Specifically, the gradient magnetic power supply 105 supplies a first current corresponding to the first-order shimming values, which in turn correspond to each of the slices in the collection region to the gradient coil 103 for each slice. The gradient coil 103 generates, by the supplied first current, a first correction magnetic field for correcting first-order components of inhomogeneity of each static magnetic field, corresponding to each slice in the collection region. The shim coil power supply 102 supplies a second current corresponding to the second-order shimming values to the shim coil 101, over a period of collection including a period of time during which the multi-slice collection is performed. The shim coil 101 generates, by the supplied second current, a second correction magnetic field for correcting second-order components of inhomogeneity of a global static magnetic field over the slices relating to the multi-slice collection. The imaging control circuitry 121 performs the multi-slice collection to the subject P by using an RF pulse having the determined per-slice frequency, along with the generation of the first correction magnetic field and the second correction magnetic field. The imaging control circuitry 121 outputs MR signals collected by the multi-slice collection to the processing circuitry 131.

According to the above-described configuration, the following advantageous effects can be obtained.

According to the MRI apparatus 1 of the present embodiment, it is possible to calculate, by using a static magnetic field distribution in the collection region (i.e., a pre-shimming distribution), multiple-order shimming values relating to the correction of second-order and higher order components of inhomogeneity of a static magnetic field for the entire collection region in the multi-slice collection, along with 0-order and first-order shimming values relating to correction of 0-order and first-order components of inhomogeneity of a static magnetic field in the collection region in each of the slices of the collection region. It is also possible to perform the multi-slice collection to the collection region by using the 0-order, first-order, and multiple-order shimming values.

Thus, according to the MRI apparatus 1 of the present embodiment and the multi-slice imaging method relating to FIG. 2, it is possible to calculate 0-order, first-order, and multiple-order shimming values in consideration of per-slice static magnetic field shimming and multiple-order shimming when static magnetic field shimming is performed to the collection region. In other words, since multiple-order shimming is uniformly performed over all of the slices in the collection region during a predetermined imaging time, it is possible to supply a second current in advance to the shim coil 101 so as to make a higher-order correction magnetic field generated by the shim coil 101 stable at the time of starting the imaging. It is thereby possible to bring out the performance of the shim coil 101 regarding higher-order shimming at its maximum, and to improve performance of static magnetic field shimming.

Figure 3:
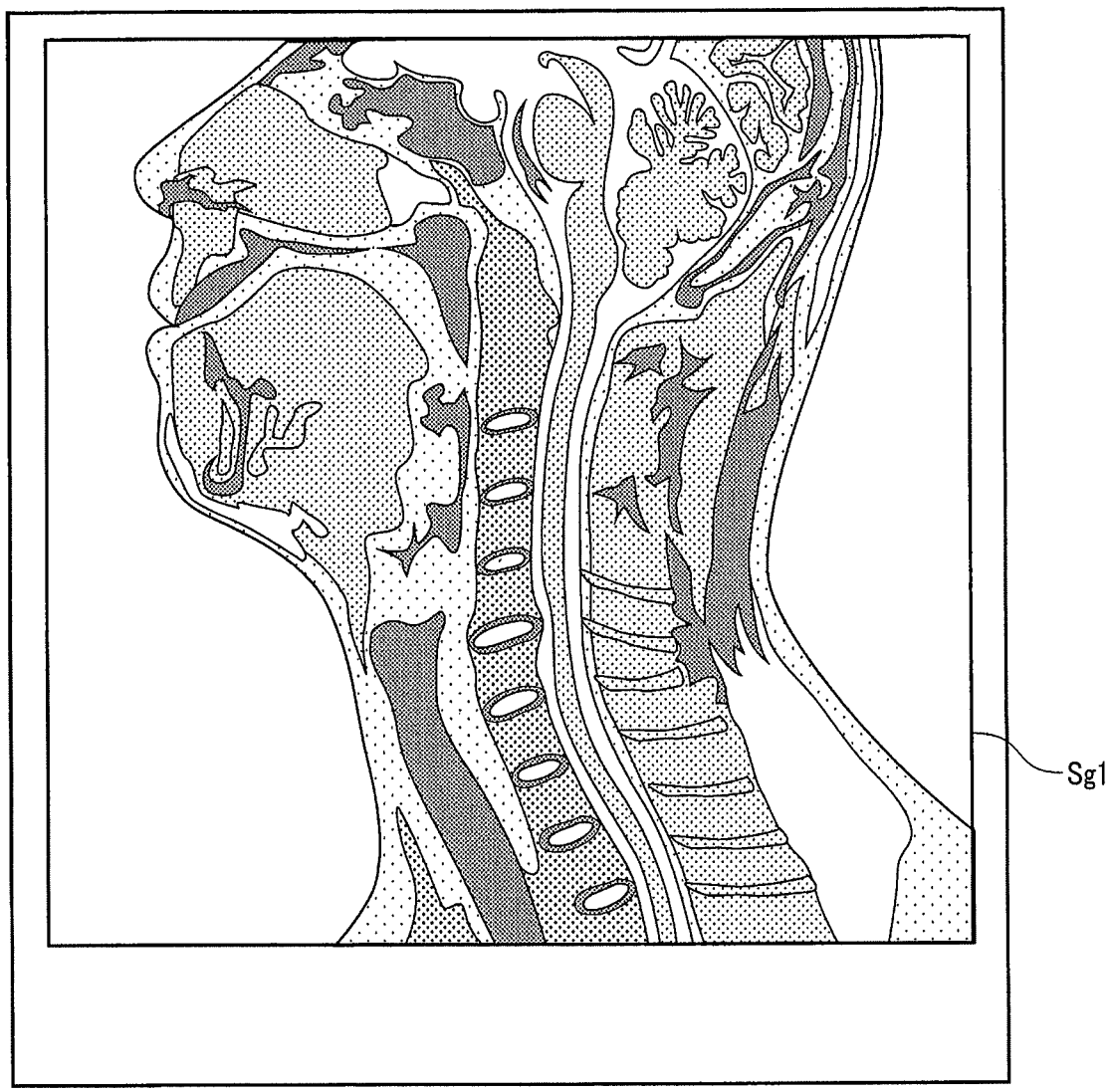
FIG. 3 is a diagram showing an example of a sagittal image of a subject relating to the descriptions of advantageous effects of the embodiment.
Figure 4:
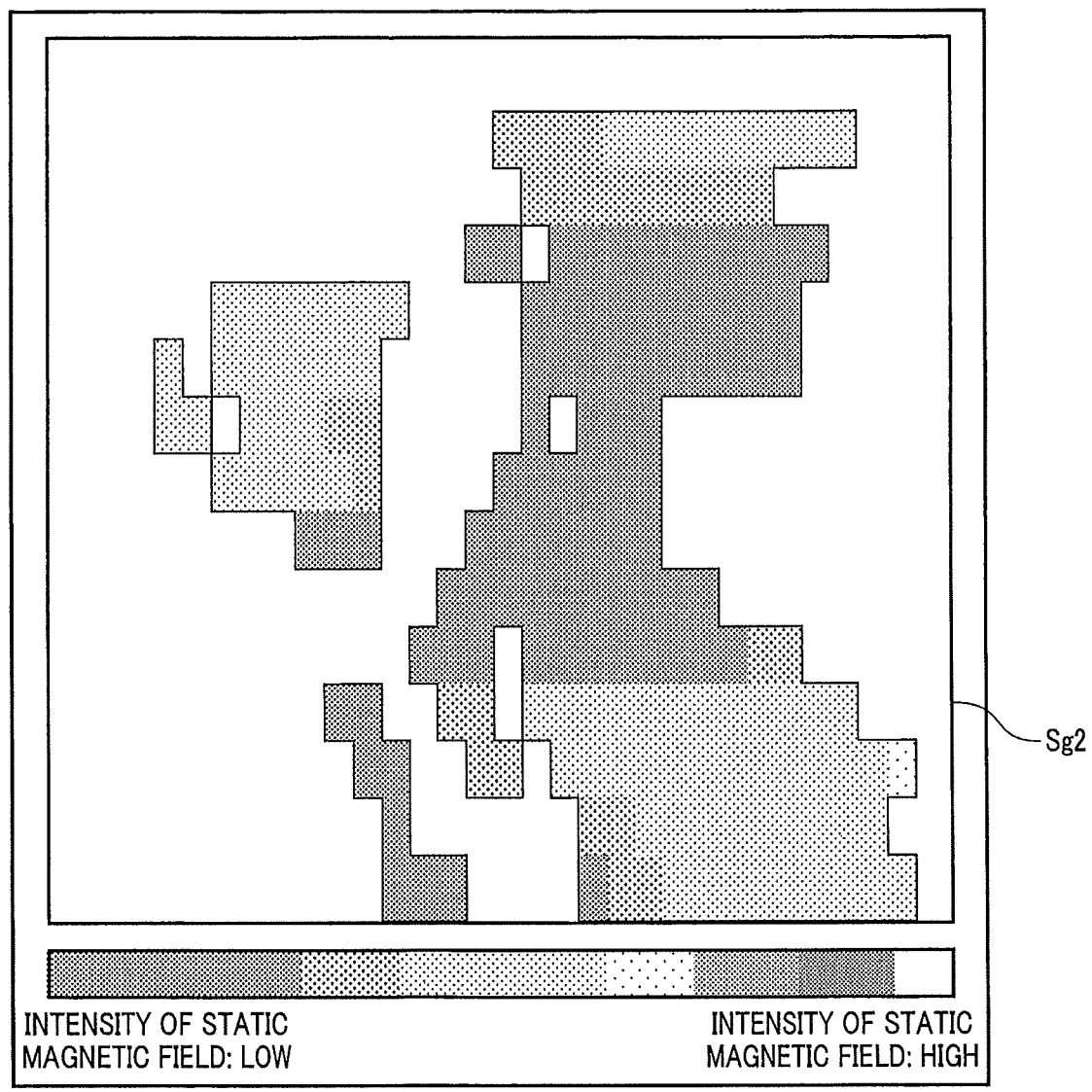
FIG. 4 is a diagram showing an example of a static magnetic field distribution before static magnetic field shimming in the same cross section as the sagittal image shown in FIG. 3, as a comparative example relating to the advantageous effects of the embodiment.
Figure 5:
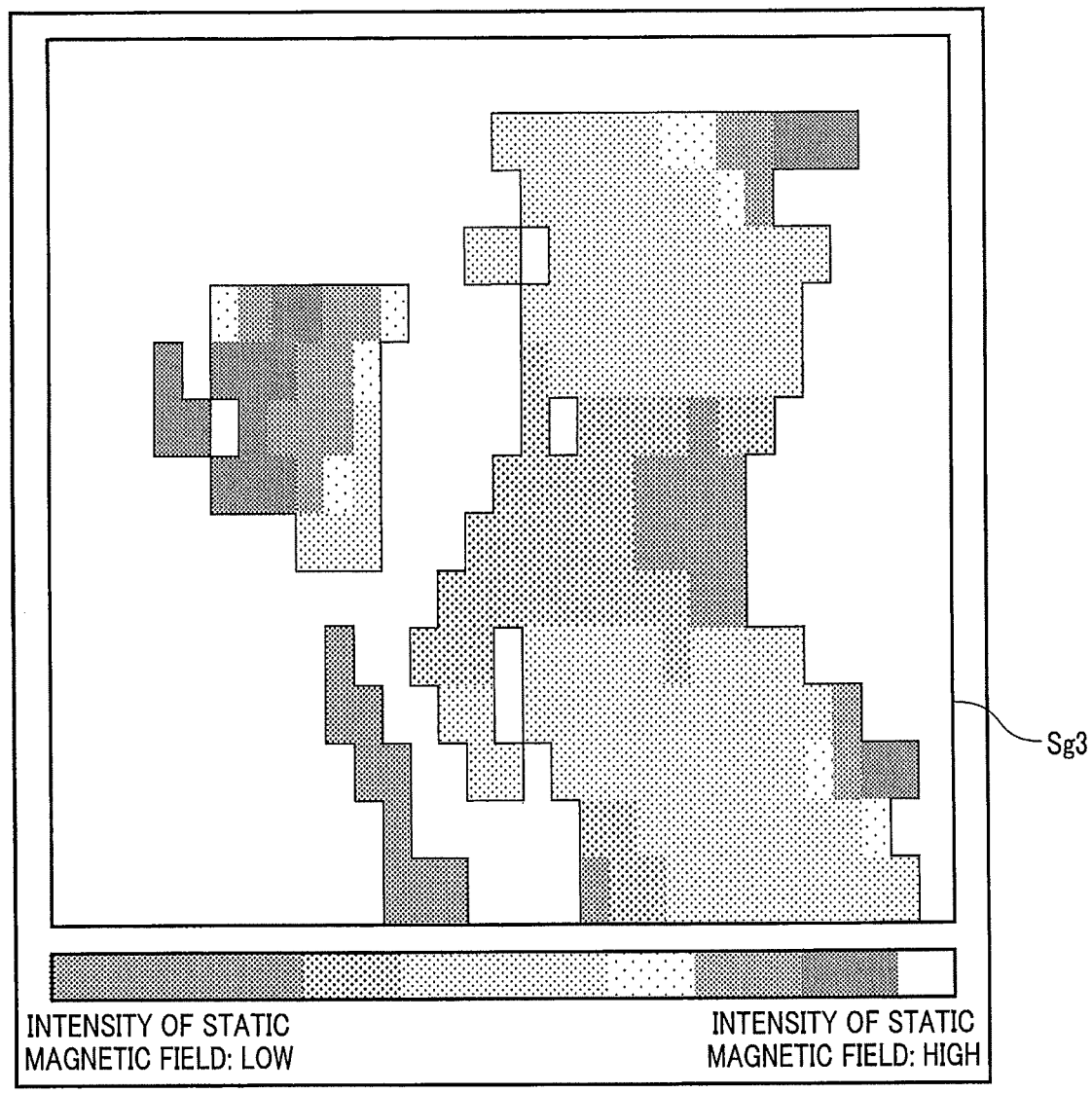
FIG. 5 is a diagram showing an example of a static magnetic field distribution when global shimming is performed to an entire collection region with respect to 0-order and second-order components of inhomogeneity of a static magnetic field, in the cross section same as the sagittal image shown in FIG. 3, as a comparative example relating to the advantageous effects of the embodiment.
Figure 6:
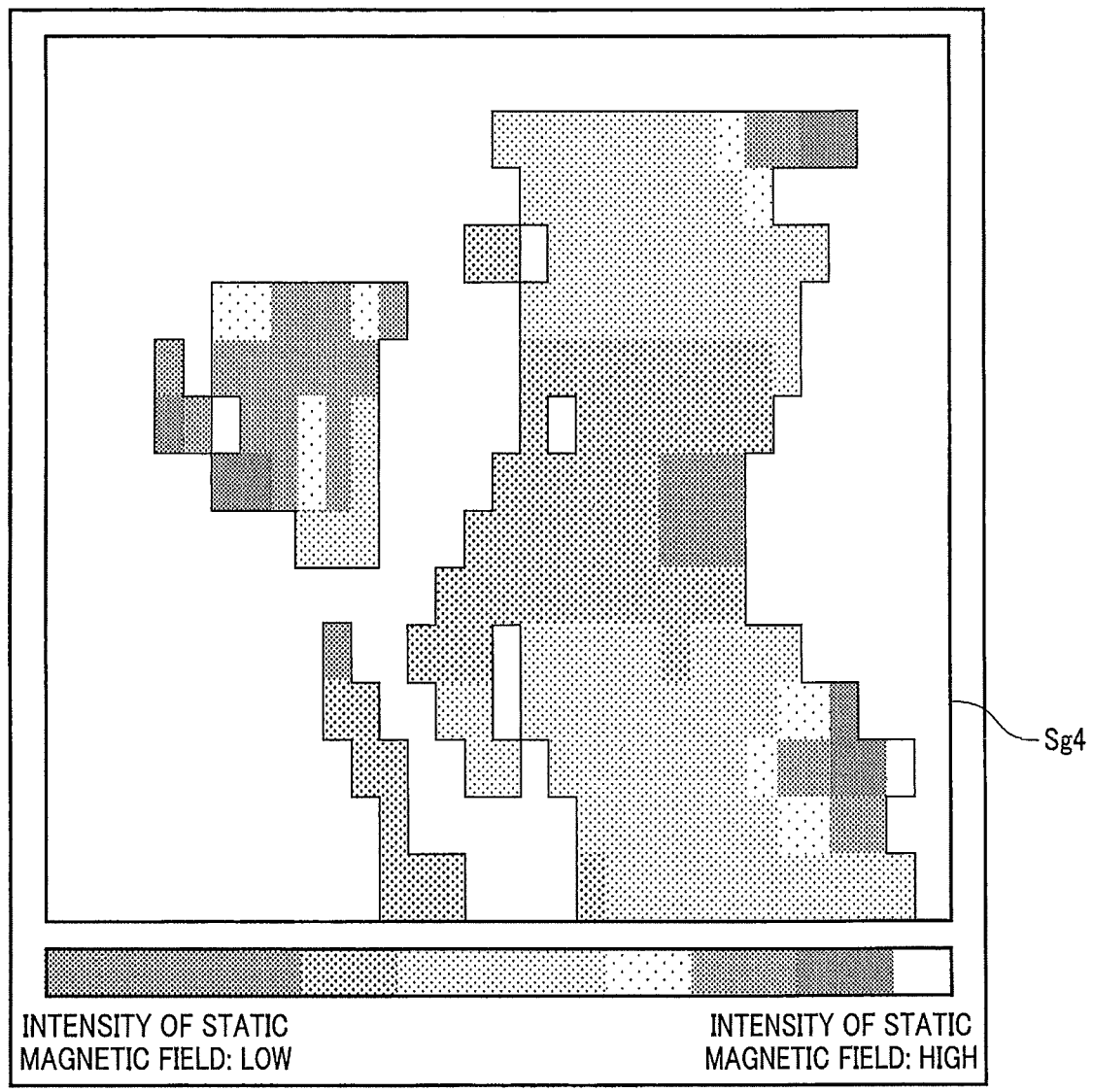
FIG. 6 is a diagram showing an example of a static magnetic field distribution when the per-slice static magnetic field shimming is performed with respect to 0-order and first-order components of inhomogeneity of a static magnetic field, in the same cross section as the sagittal image shown in FIG. 3, as a comparison example relating to the advantageous effects of the embodiment.

Hereinafter, advantageous effects of the present embodiment will be explained with reference to FIG. 3 to FIG. 7. FIG. 3 is a sagittal image Sg1 of the neck of the subject P. FIG. 4 is a diagram showing an example of the static magnetic field distribution Sg2 before static magnetic field shimming in the same cross section as the sagittal image shown in FIG. 3. As shown in FIG. 4, since the non-magnetic field distribution shimming has not yet been performed, the static magnetic field distribution has inhomogeneity. FIG. 5 is a drawing showing an example of the static magnetic field distribution Sg3, when static magnetic field shimming relating to 0-order to second-order components is performed for the entire collection region in the same cross section as the sagittal image shown in FIG. 3; in other words, global static magnetic field shimming (hereinafter referred to as global shimming), not per-slice static magnetic field shimming, is performed. As shown in FIG. 5, even if global shimming is performed, the static magnetic field distribution Sg3 has inhomogeneity of the static magnetic field. FIG. 6 is a diagram showing an example of the static magnetic field distribution Sg4 when per-slice static magnetic field shimming is performed relating to 0-order and first-order components of inhomogeneity of a static magnetic field to an entire collection region, in the cross section same as the sagittal image shown in FIG. 3. As shown in FIG. 6, even if per-slice static magnetic field shimming is performed, the static magnetic field distribution Sg4 has inhomogeneity of the static magnetic field.

Figure 7:
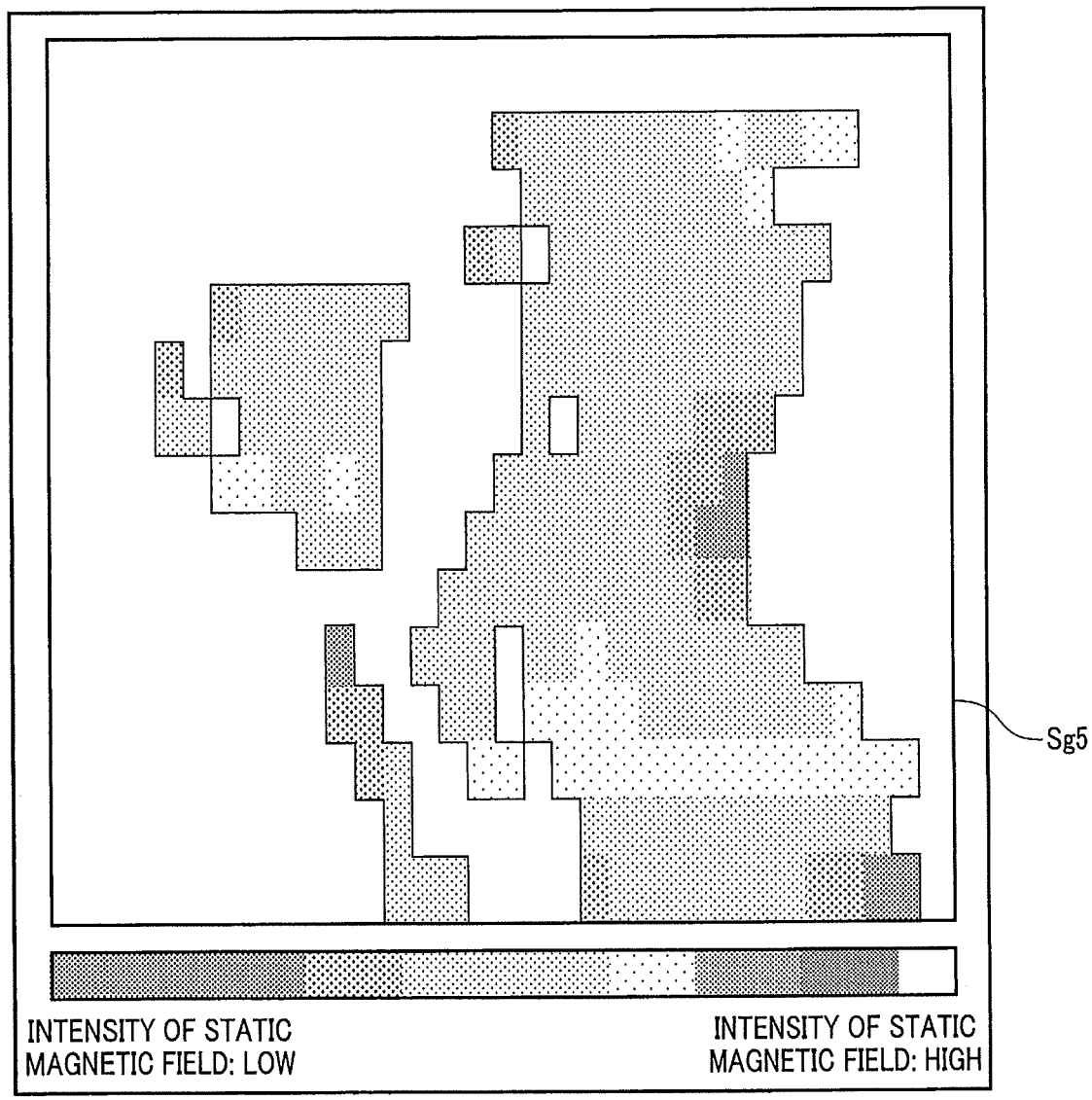
FIG. 7 is a diagram showing an example of a static magnetic field distribution as a result of shimming value calculation processing in the embodiment, in the same cross section as the sagittal image shown in FIG. 3.

FIG. 7 is a drawing showing an example of the static magnetic field distribution Sg5 as a result of performing the static magnetic field shimming of the present embodiment in consideration of multiple-order shimming over all slices of the collection region regarding the multi-slice collection and the per-slice static magnetic field shimming, namely "shimming value calculation processing". As shown in FIG. 7, the inhomogeneity of the static magnetic field distribution Sg5 is reduced compared to the inhomogeneity of the static magnetic field distributions shown in FIGS. 4 to 6. Thus, it is possible to generate an MR image, with improved image quality by the use of the MRI apparatus 1 of the present embodiment in the multi-slice collection, by using the static magnetic field shimming relating to the shimming value calculation processing.

Applied Example

Differences of the present applied example from the foregoing embodiment lie in the fact that 0-order and first-order shimming values calculated for each slice and second-order shimming values over the collection region are determined in consideration of 0-order and first-order shimming values in adjacent slices among the slices of the collection region relating to the multi-slice collection. Specifically, the processing circuitry 131 specifies multiple adjacent slices in the collection region through the calculation function 1317. The number of adjacent slices in the collection region is (M−1) if the total number of the slices in the collection region is M. The processing circuitry 131 calculates 0-order, first-order, and second-order shimming values so as to reduce the difference between 0-order shimming values and the difference between first-order shimming values in the multiple adjacent slices.

A basic expression of the static magnetic field shimming in the present applied example can be expressed as the expression (13) below:

$$b'' = X'''' a'' + b''' \qquad (13)$$

In the expression (13), if a vector b'', a matrix X'''' and a vector b''' are defined as follows:

$$b'' = \begin{pmatrix} b_1' \\ \vdots \\ \vdots \\ b_M' \\ 0 \\ \vdots \\ 0 \end{pmatrix}, X'''' = \begin{pmatrix} X_1 & 0 & \cdots & 0 & X' \\ 0 & \ddots & \ddots & \vdots & \vdots \\ \vdots & \ddots & \ddots & 0 & \vdots \\ 0 & \cdots & 0 & X_M & X' \\ \Lambda & -\Lambda & 0 & \cdots & 0 \\ 0 & \ddots & \ddots & \ddots & \vdots \\ 0 & 0 & \Lambda & -\Lambda & 0 \end{pmatrix}, b''' = \begin{pmatrix} b_1 \\ \vdots \\ \vdots \\ b_M \\ 0 \\ \vdots \\ 0 \end{pmatrix}$$

the matrix Λ in the matrix X'''' is defined as shown below by using a scalar value λ.

$$\Lambda = \begin{pmatrix} \lambda & 0 & 0 & 0 \\ 0 & \lambda & 0 & 0 \\ 0 & 0 & \lambda & 0 \\ 0 & 0 & 0 & \lambda \end{pmatrix}$$

The components relating to λ in the expression (13) are shown as the expression (14) below:

$$\begin{pmatrix} 0 \\ \vdots \\ 0 \end{pmatrix} = \lambda \begin{pmatrix} a_1 - a_2 \\ \vdots \\ a_{M-1} - a_M \end{pmatrix} \qquad (14)$$

The expression (14) shows a difference between adjacent slices (hereinafter, adjacent shimming difference) regarding the 0-order shimming values and first-order shimming values that are optimized with respect to the slices of the collection region. The scalar value λ in the expression (14) corresponds to an adjustment coefficient that indicates an extent to which the adjacent shimming difference contributes to a cost function, namely a weight. The adjustment coefficient λ is preset and stored in the storage apparatus 129. The adjustment coefficient λ may be appropriately adjusted courtesy of an operator's instruction that is input via the interface 125.

For example, if a value of the adjustment coefficient λ is increased, the contribution of the adjacent shimming difference to the cost function is also increased. For this reason, if the value of the adjustment coefficient is large, the processing circuitry 131 calculates 0-order and first-order shimming values in such a manner that a difference in the 0-order and first-order shimming values in adjacent two slices becomes smaller. In this case, the 0-order and first-order shimming values smoothly change in adjacent slices. For this reason, the value of the adjustment coefficient $\lambda$ also contributes to stability of a solution in the optimization processing for the cost function relating to the expression (13). For example, in the present applied example, the matrix $\Omega$ in the expression (5) is set for normalization, which is performed based on importance or correlation of an adjacent shimming difference.

The expression (13) has the same form as the expression (4). For this reason, for the expression (13), the processing circuitry 131 defines a cost function similarly to the expression (5) through the calculation function 1317. The processing circuitry 131 executes a least-squares method for minimizing the cost function relating to the expression (13) by a calculation program and calculates the vector a" which is a combination of 0-order, first-order, and second-order shimming values, in consideration of the smoothness of the 0-order and first-order shimming values in the adjacent slices. The shimming value calculation processing in the applied example is performed in step Sa4 shown in FIG. 2.

According to the above-described configuration, the following advantageous effects can be obtained in addition to the advantageous effects described in the present embodiment.

According to the MRI apparatus 1 in the present applied example, it is possible to calculate 0-order, first-order, and second-order shimming values so as to reduce a difference between 0-order shimming values pertaining to the adjacent slices among the slices included in the collection region in the multi-slice collection, and a difference between first-order shimming values regarding the adjacent slices. In other words, according to the MRI apparatus 1 of the present applied example, it is possible to obtain a solution in a more stable manner via the performance of the optimization processing regarding the expression (13) by reducing an adjacent shimming difference.

As modifications of the foregoing embodiment and the present applied example, if the technical idea of the present MRI apparatus 1 is realized through cloud computing or the like, a server on the Internet may have the storage apparatus 129 and the processing circuitry 131 shown in the schematic diagram of FIG. 1. In this case, the system control function 1311, the image generation function 1313, the static magnetic field distribution generation function 1315, and the calculation function 1317, etc., are realized through installing a calculation program that executes these functions onto the processing apparatus 131 of a server and expands these functions in a memory. For example, the server can perform the shimming value calculation processing, etc.

As modifications of the foregoing embodiment and the present applied example, if the technical idea of the present MRI apparatus 1 is realized through a shimming value calculation apparatus, the shimming value calculation apparatus may have the storage apparatus 129 and the processing circuitry 131 shown in the schematic diagram of FIG. 1. In this case, the storage apparatus 129 stores a static magnetic field distribution corresponding to pre-shimming distribution, or various types of data used to generate a static magnetic field distribution. The storage apparatus 129 also stores a calculation program, etc. The processing circuitry 131 can realize the shimming value calculation processing in step Sa2 and thereafter by performing a calculation program.

The transmitter in the present specification may be realized through the transmission circuitry 113 described in the embodiment, and the same function may be realized only by hardware or by a combination of hardware and software. The receiver in the present specification may be realized through the reception circuitry 119 described in the embodiment, and the same function may be realized only by hardware or by a combination of hardware and software. The imaging control unit in the present specification may be realized through the imaging control circuitry 121 described in the embodiment, and the same function may be realized only by hardware, only by software, or by a combination of hardware and software. The processor in the present specification may be realized through the processing circuitry 131 described in the embodiment, and the same function may be realized only by hardware, only by software, or by a combination of hardware and software.

According to the above-described embodiment and applied example, accuracy of static magnetic field shimming can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
processing circuitry that calculates a 0-order shimming value relating to a correction with respect to 0-order components of inhomogeneity of a static magnetic field of a collection region in a multi-slice collection for each of a plurality of slices in the collection region, first-order shimming values relating to a correction of first-order components of the inhomogeneity for each of the slices in the collection region, and multiple-order shimming values relating to a correction of second or higher-order components of the inhomogeneity over the entire of the collection region, by using a distribution of the static magnetic field in the collection region; and
imaging control circuitry that performs the multi-slice collection to the collection region by using the 0-order shimming value, the first-order shimming values, and the multiple-order shimming values.

2. The magnetic resonance imaging apparatus according to claim 1, wherein
the processing circuitry calculates the 0-order shimming value, the first-order shimming values, and the multiple-order shimming values by using the static magnetic field distribution, in such a manner as to reduce a difference of the 0-order shimming value in adjacent slices among the slices and a difference of the first-order shimming values in the adjacent slices.

3. A multi-slice imaging method comprising:
calculating a 0-order shimming value relating to a correction with respect to 0-order components of inhomogeneity of a static magnetic field of a collection region in a multi-slice collection for each of a plurality of slices in the collection region, first-order shimming values relating to a correction of first-order components of the inhomogeneity for each of the slices in the collection region, and multiple-order shimming values relating to a correction of two or higher order components of the inhomogeneity over the entire of the collection region, by using a distribution of the static magnetic field in the collection region; and performing the multi-slice collection to the collection region by using the 0-order shimming value, the first-order shimming values, and the multiple-order shimming values.

4. The multi-slice imaging method according to claim 3, wherein the calculation consists of calculating the 0-order shimming value, the first-order shimming values, and the multiple-order shimming values by using the static magnetic field distribution, in such a manner as to reduce a difference of the 0-order shimming value in adjacent slices among the slices and a difference of the first-order shimming values in the adjacent slices.

5. A shimming value calculation apparatus comprising:
processing circuitry that calculates a 0-order shimming value relating to a correction with respect to 0-order components of inhomogeneity of a static magnetic field of a collection region in a multi-slice collection for each of a plurality of slices in the collection region, first-order shimming values relating to a correction of first-order components of the inhomogeneity for each of the slices in the collection region, and multiple-order shimming values relating to a correction of two or higher order components of the inhomogeneity over the entire of the collection region, by using a distribution of the static magnetic field in the collection region.

6. The shimming value calculation apparatus according to claim 5, wherein
the processing circuitry calculates the 0-order shimming value, the first-order shimming values, and the multiple-order shimming values by using the static magnetic field distribution, in such a manner as to reduce a difference of the 0-order shimming value in adjacent slices among the slices and a difference of the first-order shimming values in the adjacent slices.

* * * * *